(12) United States Patent
Aimi et al.

(10) Patent No.: US 9,663,347 B2
(45) Date of Patent: May 30, 2017

(54) ELECTROMECHANICAL SYSTEM SUBSTRATE ATTACHMENT FOR REDUCED THERMAL DEFORMATION

(71) Applicant: General Electric Company, Schenectady, NY (US)

(72) Inventors: Marco Francesco Aimi, Niskayuna, NY (US); Yizhen Lin, Cohoes, NY (US)

(73) Assignee: General Electric Company, Schenectady, NY (US)

( * ) Notice: Subject to any disclaimer, the term of this patent is extended or adjusted under 35 U.S.C. 154(b) by 37 days.

(21) Appl. No.: 14/634,981

(22) Filed: Mar. 2, 2015

(65) Prior Publication Data
US 2016/0257558 A1 Sep. 8, 2016

(51) Int. Cl.
*H01H 57/00* (2006.01)
*B81B 3/00* (2006.01)
(Continued)

(52) U.S. Cl.
CPC .......... *B81B 3/0059* (2013.01); *B81B 3/0072* (2013.01); *H01H 59/0009* (2013.01);
(Continued)

(58) Field of Classification Search
CPC ............... H01H 59/009; H01H 1/0036; H01H 2001/0084; H01H 2001/0052;
(Continued)

(56) References Cited

U.S. PATENT DOCUMENTS

| 7,071,017 B2 * | 7/2006 | Suzuki | B81B 3/0054 257/E21.577 |
| 7,498,911 B2 | 3/2009 | Forehand | |

(Continued)

FOREIGN PATENT DOCUMENTS

| EP | 2073237 A2 | 6/2009 |
| WO | 03043095 A2 | 5/2003 |

OTHER PUBLICATIONS

Lishchynska et al., "Evaluation of Packaging Effect on MEMS Performance: Simulation and Experimental Study", Advanced Packaging, IEEE Transactions, vol. 30, No. 4, pp. 629-635, Nov. 2007.

(Continued)

*Primary Examiner* — Vanessa Girardi
(74) *Attorney, Agent, or Firm* — Ziolkowski Patent Solutions Group, SC; Jean K. Testa

(57) ABSTRACT

A MEMS switch includes a substrate and a switch structure formed on the substrate, with the switch structure further including a conductive contact formed on the substrate, a self-compensating anchor structure coupled to the substrate, and a beam comprising a first end and a second end, the beam integrated with the self-compensating anchor structure at the first end and extending out orthogonally from the self-compensating anchor structure and suspended over the substrate such that the second end comprises a cantilevered portion positioned above the conductive contact. The cantilevered portion of the beam undergoes deformation during periods of strain mismatch between the substrate and the switch structure so as to have a takeoff angle relative to the substrate, and the self-compensating anchor structure directs a portion of the strain mismatch orthogonally to the cantilevered portion so as to warp the anchor and compensate for the takeoff angle of the cantilevered portion.

19 Claims, 9 Drawing Sheets

(51) Int. Cl.
*H01H 59/00* (2006.01)
*H01H 1/00* (2006.01)

(52) U.S. Cl.
CPC ............... *B81B 2203/053* (2013.01); *H01H 2001/0084* (2013.01)

(58) Field of Classification Search
CPC ... B81B 3/0081; B81B 3/0072; B81B 3/0078; B81B 2201/01; B81B 2201/13; B81B 2203/00; B81B 2203/01; B81B 2203/0307; B81B 7/0019
USPC .................................................. 200/181, 283
See application file for complete search history.

(56) References Cited

U.S. PATENT DOCUMENTS

| | | | |
|---|---|---|---|
| 8,054,147 | B2 | 11/2011 | Hays et al. |
| 8,322,212 | B2 | 12/2012 | Rocchi |
| 8,354,901 | B1 | 1/2013 | Hammond |
| 8,570,122 | B1 | 10/2013 | Hammond |
| 8,659,373 | B2 | 2/2014 | Ellis et al. |
| 8,680,955 | B1 | 3/2014 | Hammond |
| 8,779,886 | B2 | 7/2014 | Aimi et al. |
| 2003/0127698 | A1 | 7/2003 | Lee |
| 2010/0155202 | A1 | 6/2010 | Ellis et al. |
| 2010/0181631 | A1 | 7/2010 | Lacey |
| 2012/0274176 | A1 | 11/2012 | Leverrier et al. |
| 2014/0009035 | A1 | 1/2014 | Toyoda |
| 2014/0085698 | A1 | 3/2014 | Wu et al. |
| 2015/0311003 | A1* | 10/2015 | Fitzgerald ............ H01H 1/0036 200/181 |

OTHER PUBLICATIONS

International Search Report and Written Opinion issued in connection with corresponding Application No. PCT/US2016/016075 on Jun. 21, 2016.

* cited by examiner

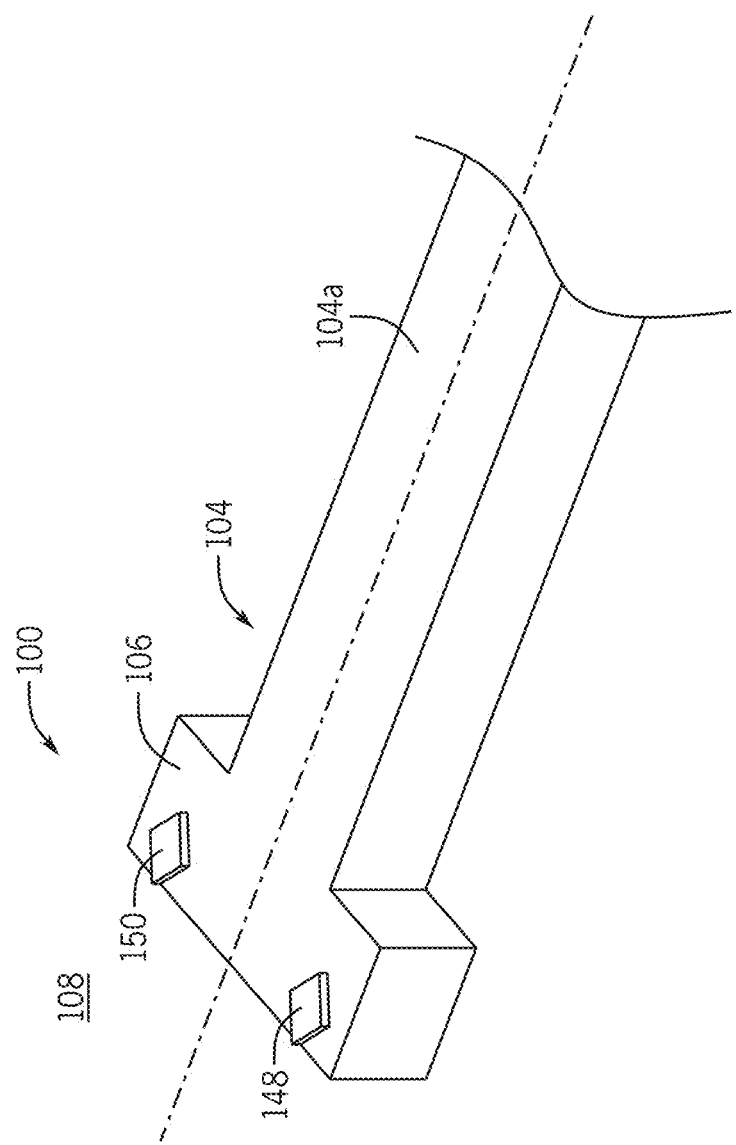

ELECTROMECHANICAL SYSTEM SUBSTRATE ATTACHMENT FOR REDUCED THERMAL DEFORMATION

BACKGROUND OF THE INVENTION

Embodiments of the invention relate generally to Micro-Electro-Mechanical Systems (MEMS) switches and, more particularly, to MEMS switches having an anchor design that reduces the impact of any strain mismatch between the MEMS switch and the substrate on which the MEMS switch is mounted.

MEMS is a technology that in its most general form can be defined as miniaturized mechanical and electro-mechanical elements (i.e., devices and structures) that are made using the techniques of microfabrication. The critical physical dimensions of MEMS devices can vary from well below one micron on the lower end of the dimensional spectrum, all the way to several millimeters. Likewise, the types of MEMS devices can vary from relatively simple structures having no moving elements, to extremely complex electro-mechanical systems with multiple moving elements under the control of integrated microelectronics, with MEMS often acting as relays, for example (hereinafter referred to as "MEMS switches").

With respect to MEMS switches, the one main criterion of MEMS switches is that there are at least some elements having some sort of mechanical functionality, whether or not these elements can move. Accordingly, MEMS switches generally include a moveable portion such as a cantilever, which has a first end anchored to a substrate (i.e., an "anchor"), and a second free end having a cantilever contact. When the MEMS switch is activated, the cantilever moves the cantilever contact against a substrate contact on the substrate and under the cantilever contact.

A problem of undesirable deformation of MEMS switches often occurs due to a significant difference in the coefficient of thermal expansion (CTE) between the metal comprising the MEMS switch and the semiconductor substrate, with it being recognized that the substrate includes numerous layers/materials such as a handle wafer, an insulator layer, a device layer, a metal-dielectric stack, and a passivation layer, for example. The CTE of the metal making up the MEMS switch often ranges from two to seven times larger than the CTE of the semiconductor substrate (e.g., of the insulator making up the passivation layer). At room temperature (i.e., 25° C.), the difference in the CTE does not present a problem; however, during manufacture, assembly, or operation of the MEMS switch, the temperature of the MEMS switch and the substrate structure 14 can exceed 300° C., with temperatures of 400° C.-700° C. not being uncommon, depending on the wafer bonding process employed.

Responsive to these high temperatures to which the MEMS switch is exposed to, the strain state of the MEMS switch may change—with the change in strain rate being due to the CTE mismatch as well as annealing of the MEMS film (due to several effects such as void reduction, grain growth, etch). The change in strain rate can lead to recoverable and non-recoverable deformations of the cantilever, with such deformation potentially causing the MEMS switch to become non-functional if severe enough in magnitude. That is, an adhesion between the cantilever contact and the substrate contact may prevent the cantilever contact and the substrate contact from breaking contact as the temperature of the MEMS switch decreases. A failure to break contact between the cantilever contact and the substrate contact will result in a failed MEMS switch, along with a failed product incorporating the MEMS switch. Furthermore, permanent deformation of the switch can result in altered switch performance beyond the acceptable operational range.

Prior attempts to solve this problem have been focused around minimizing the issues. For example, one solution has been to decrease the size of the region of the MEMS switch directly attached to the semiconductor substrate so as to minimize the strain-induced deflection of the cantilever. Another solution has been to decrease the size of the anchor in order to minimize the strain-induced deflection of the cantilever. However, such a reduction in the size of the anchor can lead to yield issues due to the difficulty in providing anchors of such size.

Therefore, it is desirable to provide a MEMS switch having a structure that is resistant to thermal actuation and deformation of the cantilever that might occur during manufacture, assembly, or operation of the MEMS switch. It is further desirable that such a MEMS switch be manufacturable at low cost while minimizing yield loss.

BRIEF DESCRIPTION OF THE INVENTION

Embodiments of the invention are directed to a MEMS switch having a cantilever with an anchor on one end thereof that includes two connections to the substrate. These anchor connections are oriented orthogonal to the cantilever beam such that, when there is strain relative to the substrate, the strain orthogonal to the cantilever warps the anchor enough to compensate for the strain gradient from the substrate to the top of the anchor.

In accordance with one aspect of the invention, a MEMS switch includes a substrate and a switch structure formed on the substrate, with the switch structure further including a conductive contact formed on the substrate, a self-compensating anchor structure coupled to the substrate, and a beam comprising a first end and a second end, the beam integrated with the self-compensating anchor structure at the first end and extending out orthogonally from the self-compensating anchor structure and suspended over the substrate such that the second end comprises a cantilevered portion positioned above the conductive contact. The cantilevered portion of the beam undergoes deformation during periods of strain mismatch between the substrate and the switch structure so as to have a takeoff angle relative to the substrate, and the self-compensating anchor structure directs a portion of the strain mismatch orthogonally to the cantilevered portion so as to warp the anchor and compensate for the takeoff angle of the cantilevered portion.

In accordance with another aspect of the invention, a method of manufacturing a MEMS switch includes providing a substrate and forming a switch structure on the substrate via a wafer level bonding process. Forming the switch structure further includes forming a conductive contact on the substrate, forming a self-compensating anchor structure, and attaching a cantilevered beam to the self-compensating anchor structure to position the cantilevered beam relative to the substrate and the conductive contact, the cantilevered beam comprising a cantilevered portion at an end thereof opposite the self-compensating anchor structure, with the self-compensating anchor structure being arranged orthogonally to the cantilevered portion of the cantilevered beam and with the cantilevered portion extending out so as to be spaced apart from the substrate and positioned above the conductive contact. The method also includes performing an annealing process on the substrate and the switch structure to achieve bonding in the MEMS switch. The cantilevered portion of the beam undergoes deformation during the annealing process responsive to a strain mismatch between the substrate and the switch structure, such that the cantilevered portion has a takeoff angle relative to the substrate, and the self-compensating anchor structure directs a portion of a strain resulting from the strain mismatch orthogonal to the cantilevered portion so as to warp the anchor structure and compensate for the takeoff angle of the cantilevered portion.

In accordance with yet another aspect of the invention, a MEMS switch includes a substrate and a switch structure formed on the substrate, with the switch structure further including a conductive contact formed on the substrate, an anchor structure coupled to the substrate, and a beam integrated with the anchor structure and extending out orthogonally therefrom, the beam comprising a cantilevered portion suspended over the substrate and positioned above the conductive contact. The anchor structure comprises a self-compensating anchor structure that causes the cantilevered portion to remain undeflected when subjected to thermally induced takeoff angle deformation.

Various other features and advantages will be made apparent from the following detailed description and the drawings.

BRIEF DESCRIPTION OF THE DRAWINGS

The drawings illustrate embodiments presently contemplated for carrying out the invention.

In the drawings:

FIG. 12 is a perspective view of a cantilever beam attached to an anchor structure, according to an embodiment of the invention.

DETAILED DESCRIPTION

Embodiments of the invention provide a MEMS switch having a cantilever with a self-compensating anchor structure on one end. The self-compensating anchor structure is oriented t such that when there is strain relative to the substrate, the strain orthogonal to the cantilever warps the anchor enough to compensate for the strain gradient from the substrate to the top of the anchor.

Figure 1:
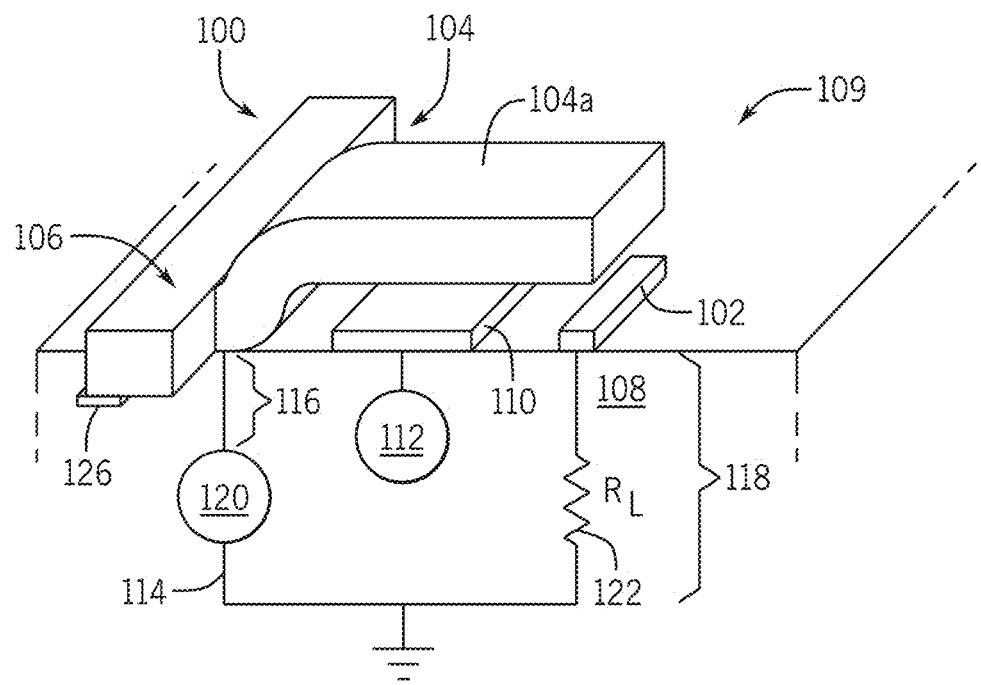
FIG. 1 is a schematic perspective view of a MEMS switch configured in accordance with an exemplary embodiment.
Figure 2:
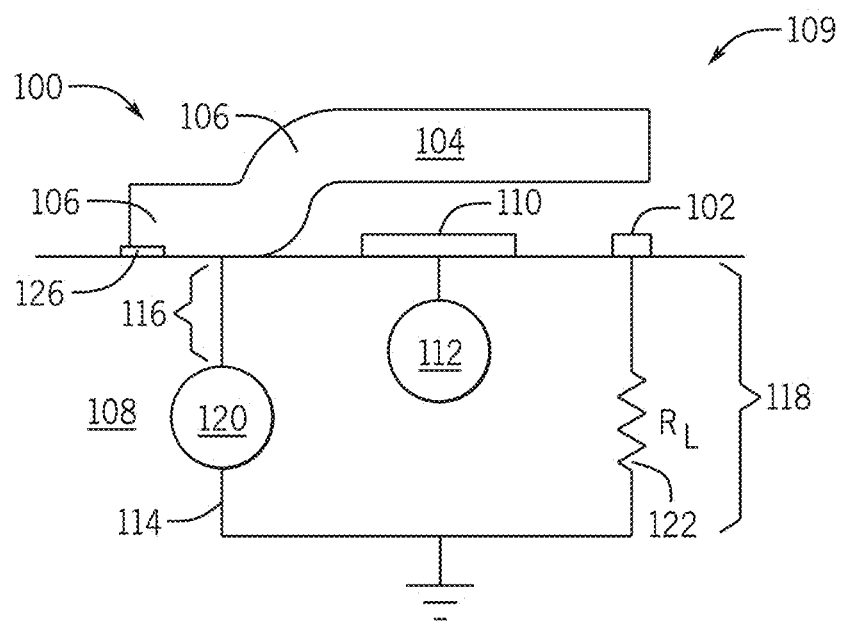
FIG. 2 is a schematic side view of the MEMS switch of FIG. 1.
Figure 3:
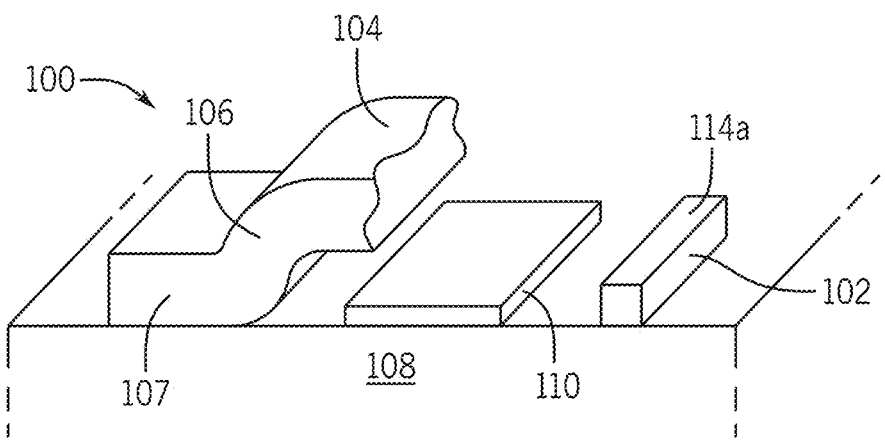
FIG. 3 is a schematic fragmentary perspective view of the MEMS switch of FIG. 1.

Referring to FIGS. 1-3, several views are shown of a switch structure 100 configured in accordance with an exemplary embodiment. The exemplary switch structure 100 includes a contact 102, which at least partially comprises a conductive material (e.g., a metal). The switch structure 100 also includes a conductive element, illustrated as a cantilevered beam 104, comprising conductive material (e.g., a metal). A cantilevered portion 104a of the beam 104 extends over the contact 102. In some embodiments, the conductive element may also include other features, such as, for example, a protective (and possibly non-conductive) coating on the beam 104 or a contact pad disposed along the portion of the beam intended to make contact with the contact 102. The beam 104 is supported by an anchor structure 106, from which the cantilevered portion 104a extends, and which may be integrated with the beam 104. The anchor structure 106 serves to connect the cantilevered portion 104a of the beam 104 to an underlying support structure, such as the illustrated substrate 108. In the embodiment of the switch structure 100 shown in FIGS. 1-3, both the contact 102 and the anchor structure 106 are formed on the substrate 108 with conventional microfabrication techniques (e.g., electroplating, vapor deposition, photolithography, wet and/or dry etching, etc.).

The switch structure 100 may constitute a portion of a microelectromechanical or nanoelectromechanical device or a microelectromechanical system (MEMS) switch 109. For example, the contact 102 and beam 104 may have dimensions on the order of ones or tens of nanometers or micrometers. In one embodiment, the beam 104 may have a surface area-to-volume ratio that is greater than or equal to $10^8$ m$^{-1}$, while in another embodiment the ratio may be closer to $10^3$ m$^{-1}$.

Integrated circuitry may be formed on the substrate 108, e.g., including metal-oxide-semiconductor field effect transistors (MOSFETs) and patterned conductive layers (not shown) that serve to provide electrical connections among the various components. Such patterned conductive layers may also provide electrical connections to the contact 102 and beam 104 (the connection to the latter being, for example, through the anchor structure 106), which connections are shown schematically in FIGS. 1 and 2 and described below. The semiconductor devices and conductive layers, like the features of the switch structure 100, can also be fabricated using conventional micro-fabrication techniques. In one embodiment, the substrate 108 may be a portion of a monocrystalline semiconductor wafer that has been processed so as to include one or more MOSFETs, with the switch structure 100 and other circuitry formed on a surface of the wafer. The switch structure 100 may be disposed over one of the MOSFETs (e.g., along a line normal to the surface of the wafer) and may be operable along with the MOSFET, with the switch structure 100 and substrate 108 being formed via a wafer level bonding. The switch structure 100 may be encapsulated by one or more encapsulating layers (not shown), which make up a wafer level package (WLP) around the switch structure 100, with the encapsulating layers forming a substantially hermetically sealed cavity about the switch structure 100 that is generally filled with an inert gas.

Figure 4:
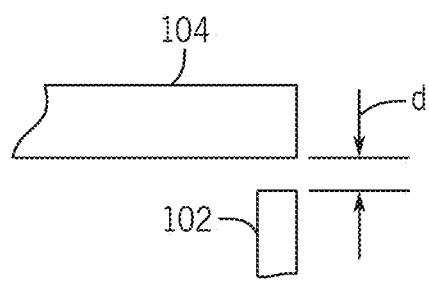
FIG. 4 is a schematic side view of the MEMS switch of FIG. 1 in an open position.
Figure 5:
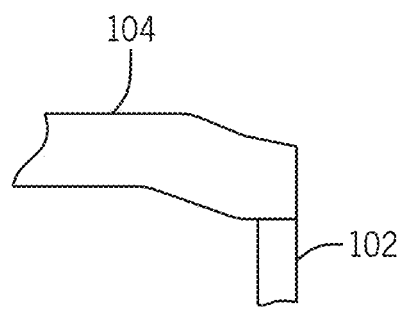
FIG. 5 is a schematic side view of the MEMS switch of FIG. 1 in a closed position.

Referring also to FIGS. 4 and 5, the beam 104 can be configured to be selectively moveable between a first, non-contacting or "open" position, shown in FIG. 4, in which the beam is separated from the contact 102 by a separation distance d, and a second, contacting or "closed" position, shown in FIG. 5, in which the beam comes into electrical contact with the contact 102. For example, the beam 104 can be configured to undergo deformation when moving between the contacting and non-contacting positions, such that the beam is naturally disposed (i.e., in the absence of externally applied forces) in the non-contacting position and may be deformed so as to occupy the contacting position while storing mechanical energy therein. In other embodiments, the undeformed configuration of the beam 104 may be the contacting position.

The switch structure 100 may also include an electrode 110 which, when appropriately charged, provides a potential difference between the electrode and the beam 104, resulting in an electrostatic force that pulls the beam toward the electrode and against the contact 102. With application of sufficient voltage to the electrode 110, the electrostatic force deforms the beam 104 and thereby displaces the beam from the non-contacting (i.e., open or non-conducting) position shown in FIG. 4 to the contacting (i.e., closed or conducting) position shown in FIG. 5. Therefore, the electrode 110 may act as a "gate" with respect to the switch structure 100, with voltages (referred to as "gate voltages") applied to the electrode 110 serving to control the opening or closing of the switch structure. The electrode 110 may be in communication with a gate voltage source 112, so that a gate voltage $V_G$ may be selectively applied to the electrode 110.

The contact 102 and the beam 104 are components of the circuit 114. The exemplary circuit 114 has a first side 116 and a second side 118 that, when disconnected from one another, are at different electric potentials relative to one another (as where only one of the sides is connected to a power source 120). The contact 102 and beam 104 can be respectively connected to either of the sides 116, 118 of the circuit 114, such that deformation of the beam between the first and second positions acts to respectively pass and interrupt a current therethrough. The beam 104 may be repeatedly moved into and out of contact with the contact 102 at a frequency (either uniform or non-uniform) that is determined by the application for which the switch structure 100 is utilized. When the contact 102 and the beam 104 are separated from one another, the voltage difference between the contact and beam is referred to as the "stand-off voltage."

In one embodiment, the beam 104 may be in communication (e.g., via the anchor structure 106) with the power source 120, and the contact 102 may be in communication with an electrical load 122 having a load resistance $R_L$. The power source 120 may be operated as a voltage source or a current source. The beam 104 acts as an electrical contact, allowing a load current (e.g., with an amplitude greater than or equal to about 1 mA and an oscillation frequency of about 1 kHz or less) to flow from the power source 120 through the beam 104, into the contact 102 and to the electrical load 122 when the beam is in the contacting position, and otherwise disrupting the electrical path and preventing the flow of current from the power source to the load when the beam is in the non-contacting position. The above-indicated current and switching frequency might be utilized in relatively higher power distribution applications. In other embodiments, such as in applications where the switch structure 100 will be utilized in a signaling context (often operating at relatively lower powers), the power source 120 may provide a current having a magnitude of 100 mA or less (and down to the 1 .mu·A range) with a frequency of oscillation greater than 1 kHz.

The above-described switch structure 100 could be utilized as part of a circuit including other switch structures, whether similar or dissimilar in design, in order to increase the current and voltage capacity of the overall circuit. Such switch structures could be configured in series or in parallel to facilitate an even distribution of stand-off voltage when the switch structures are open and an even distribution of current when the switch structures are closed.

It is recognized that the MEMS switch 109 experiences thermal cycles with extreme temperature ranges during manufacturing and operation thereof. For example, during manufacture, assembly, and/or operation of the MEMS switch 109, the temperature of the MEMS switch 109 can range from 25° C. to in excess of 300° C. (e.g., 400° C.)—such as during an annealing step performed as part of a wafer level bonding process. Exposure of the MEMS switch 109 to this range of temperatures can lead to a problem of undesirable deformation of the switch structure 100—i.e., of the cantilevered beam 104—that results from changes in the strain state of the switch structure. The change in strain rate can result from a significant difference in the CTE between materials in the MEMS switch 109 as well as annealing of the substrate 108 (due to several effects such as void reduction, grain growth, etch), with the change in strain rate causing recoverable and non-recoverable deformations of the cantilevered beam 104 that can potentially cause the switch structure 100 to become non-functional if severe enough in magnitude.

Figure 6:
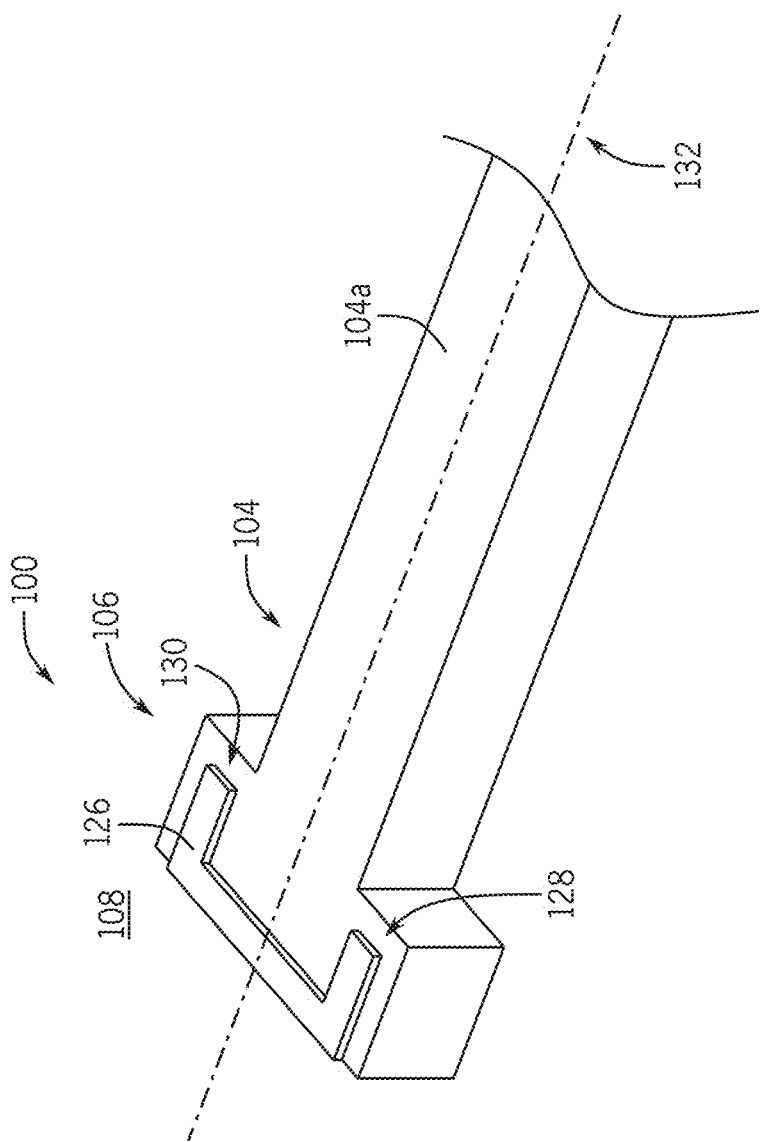
FIG. 6 is a perspective view of the anchor structure of the MEMS switch of FIG. 1 in greater detail, with an anchor connection being formed thereon, according to an embodiment of the invention.

To reduce the impact of any strain mismatch between the substrate 108 and the switch structure 100, embodiments of the invention provide a switch structure 100 having an anchor structure 106 with a 3-D deformed structure that compensates for typical takeoff angle deformation of the cantilevered beam 104 resulting from the strain mismatch—i.e., a self-compensating anchor structure. Referring again to FIG. 1 and now additionally to FIG. 6, the anchor structure 106 of switch structure 100 is shown in greater detail according to an exemplary embodiment. As shown in FIGS. 1 and 6, the anchor structure 106 is formed/attached to cantilevered beam 104 such that the anchor structure 106 is oriented orthogonal to the cantilevered portion 104a of the beam 104. The anchor structure 106 includes thereon one or more anchor connections 126 by which the anchor structure 106 and cantilevered beam 104 are mechanically connected to the substrate 108. According to an exemplary embodiment, the one or more anchor connections 126 are provided as a single/unitary element that can generally be described as a shaped anchor connection. The single shaped anchor connection 126 is structured such that a cross-section of the shaped anchor connection 126 taken orthogonal to the cantilevered beam 104 would pass through more than one region of the shaped anchor connection—i.e., there would be at least two distinct regions (generally identified as 128 and 130) where the shaped anchor connection mechanically connects the anchor 106/beam 104 to the substrate 108. Furthermore, the single shaped anchor connection 126 is formed and positioned on anchor structure 106 such that the connection is symmetrical about a longitudinal axis 132 of the cantilevered beam 104.

Figure 7:
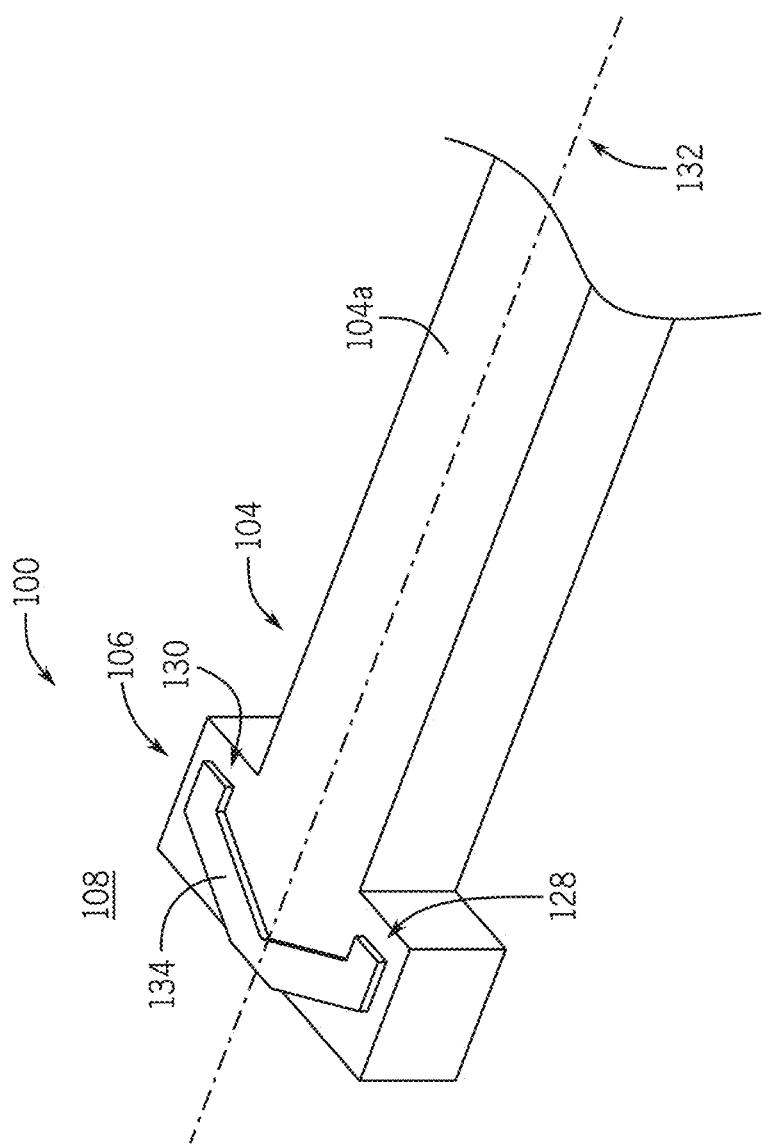
FIG. 7 is a perspective view of the anchor structure of the MEMS switch of FIG. 1 in greater detail, with an anchor connection being formed thereon, according to an embodiment of the invention.

Referring to the particular embodiment of FIG. 6, the anchor connection is constructed as a C-shaped anchor connection 126 that is symmetrical about the longitudinal axis 132 of the cantilevered beam 104. However, according to an alternative embodiment, an anchor connection 134 on the anchor structure 106 may be constructed as a V-shaped anchor connection that is symmetrical about the longitudinal axis 132 of the cantilevered beam 104, as illustrated in FIG. 7. In either of these embodiments, the anchor connection 126, 134 provides for the anchor structure 106 to act as a self-compensating anchor structure that compensates for typical takeoff angle deformation of the cantilevered beam 104 resulting from the strain mismatch. That is, during periods of strain mismatch between the substrate 108 and the switch structure 100—such as at temperatures exceeding 300° C.—the cantilevered portion 104a of the beam 104 undergoes deformation so as to have a "takeoff angle" relative to the substrate 108, i.e. deflects toward the substrate 108 in a z-direction. The construction of the anchor connection 126, 134, along with the general orientation thereof in a direction orthogonal to the orientation of the cantilevered portion 104a, functions to compensate for this takeoff angle by utilizing a strain gradient in an orthogonal direction to the takeoff angle. This strain operates through Poisson's ratio—i.e., the negative ratio of transverse to axial strain—of the cantilevered beam metal to effectively pull the cantilevered portion 104a of beam 104 back into an undeflected/undeformed position. That is, when the cantilevered portion 104a is strained relative to the substrate 108 (i.e., strain mismatch), a portion of the strain is directed orthogonal to the cantilevered portion 104a, with this portion of the strain warping the anchor structure 106 enough to compensate for the strain gradient from the substrate 108 to the top of the anchor structure 106. In other words, the portion of strain mismatch directed orthogonal to the cantilevered portion 104a develops a gradient of strain normal to the substrate 108, so as to pull the cantilevered portion 104a back into an undeflected or undeformed position. According to an exemplary embodiment, the strain directed orthogonally to the cantilevered portion 104a extends less than 20% of the length of the cantilever beam 104—with this length to which the strain extends being sufficient to prevent deflection of the cantilevered portion 104a. Accordingly, the construction of the anchor structure 106 as a self-compensating anchor structure results in a cantilevered beam 104 that is totally self-compensating, which means that the same strain that causes the takeoff angle of the cantilevered portion 104a is also used to compensate and pull the beam 104 flat.

Figure 8:
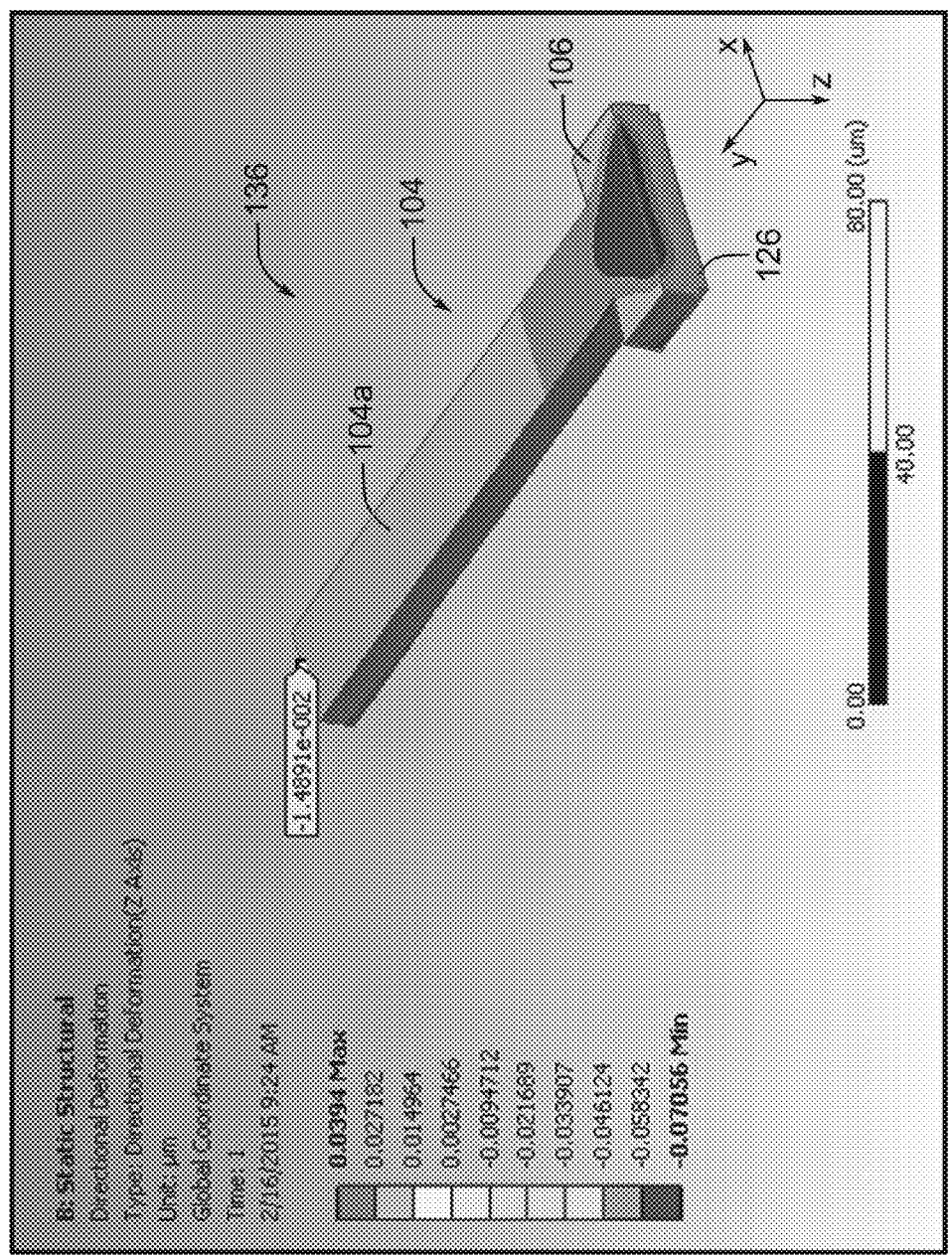
FIG. 8 is a strain map of the cantilevered beam of FIG. 1.
Figure 9:
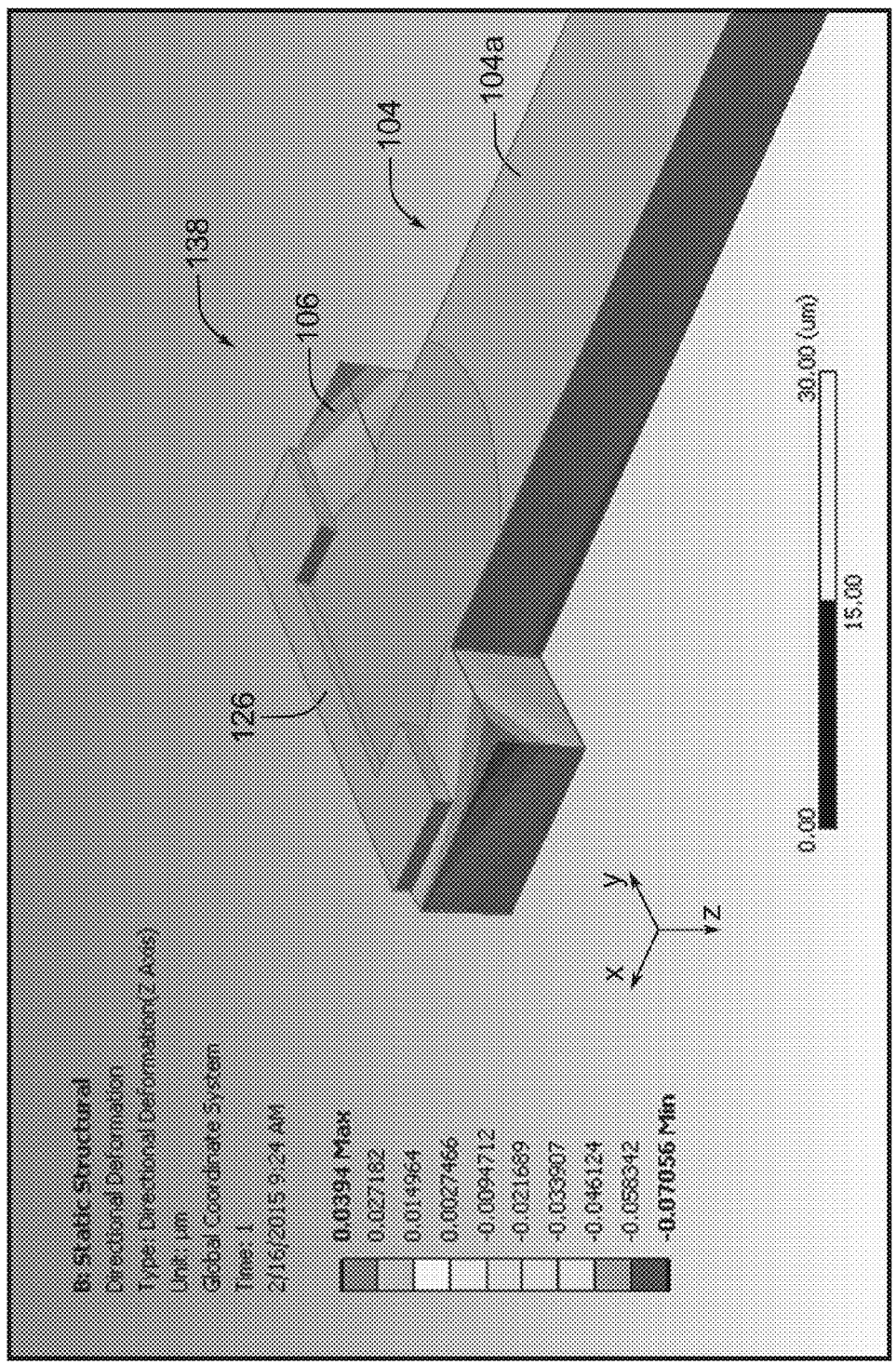
FIG. 9 is a strain map of the anchor of the cantilevered beam of FIG. 1.

Referring now to FIGS. 8 and 9, strain maps 136, 138 are provided that illustrate the level/magnitude of strain experienced by the overall cantilevered beam 104 and by the anchor structure 106, respectively, for an anchor connection 126 provided as in FIG. 6 (i.e., a C-shaped anchor connection). The strain maps 136, 138 illustrate that a maximum amount of strain is experienced adjacent the anchor structure 106 and that a minimum amount of strain is experienced at the distal end of the cantilevered portion 104a. The strain orthogonal to the cantilevered portion 104a, experienced adjacent anchor connection 126, warps the anchor structure 106 enough to compensate for the strain gradient from the substrate 108 to the top of the anchor structure 106, therefore pulling the cantilevered portion 104a back into an undeflected/undeformed position.

Figure 10:
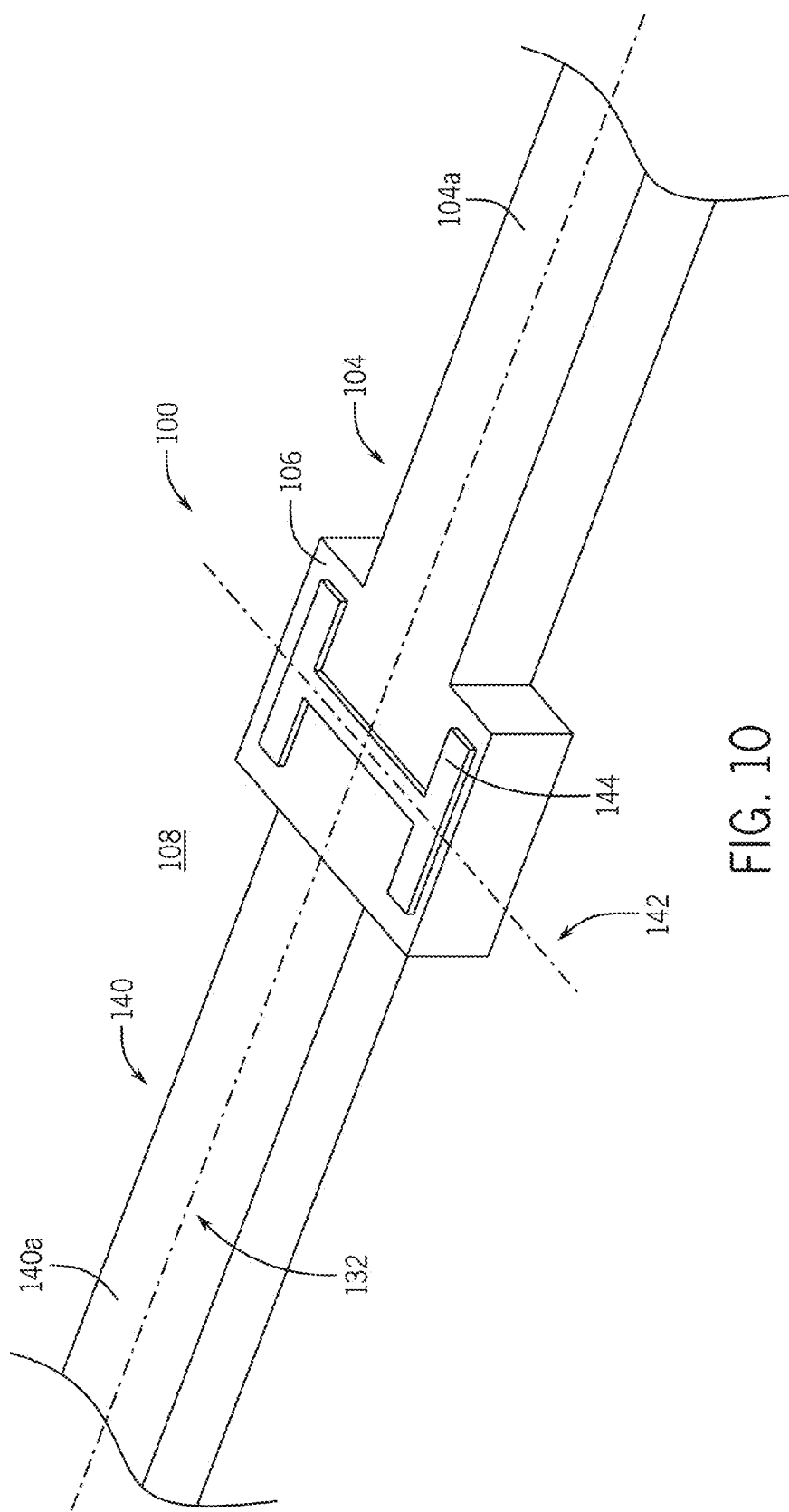
FIG. 10 is a perspective view of a switch structure with a double cantilever beam attached to an anchor structure, according to an embodiment of the invention.
Figure 11:
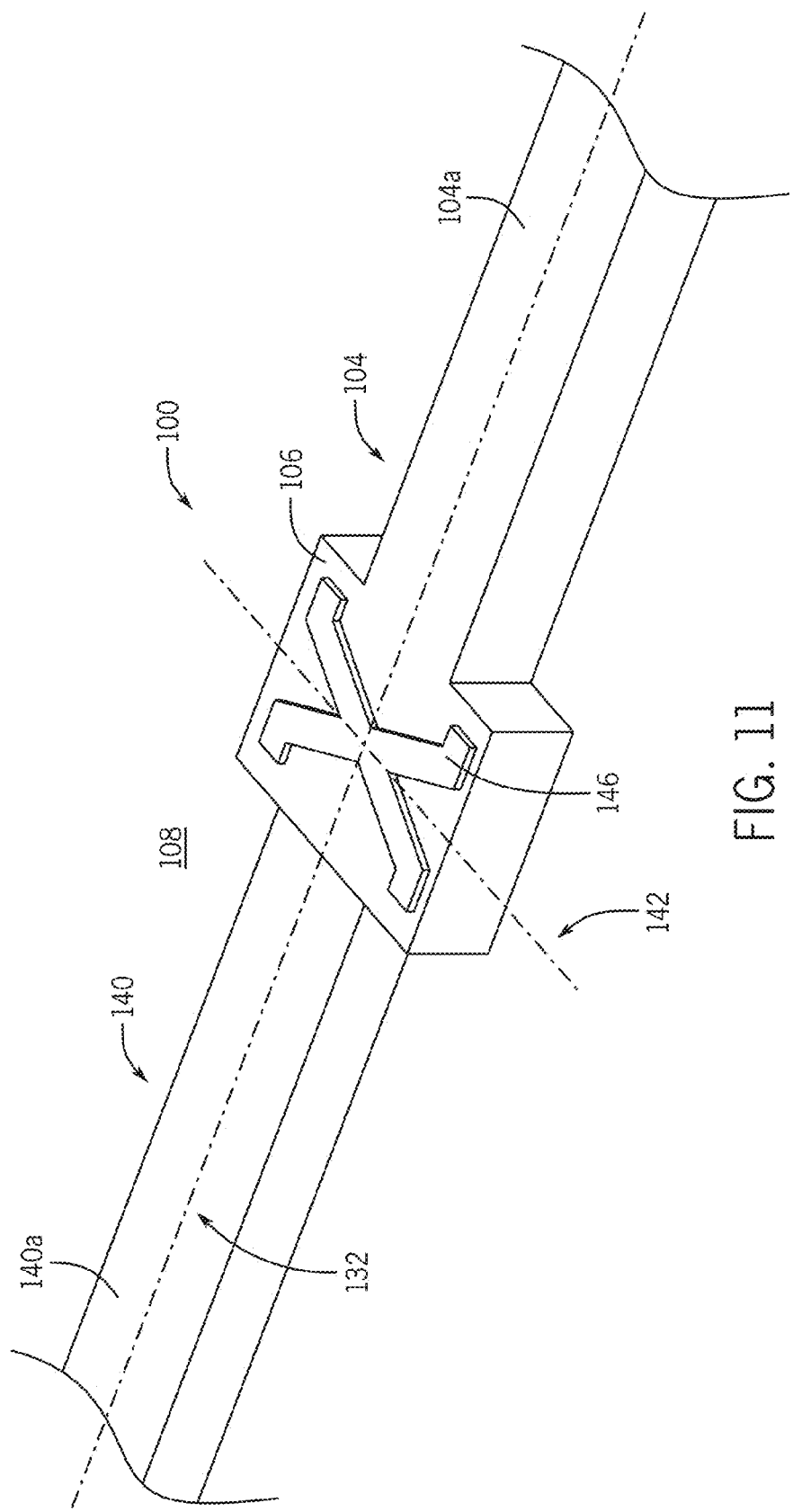
FIG. 11 is a perspective view of a switch structure with a double cantilever beam attached to an anchor structure, according to an embodiment of the invention.

Referring now to FIGS. 10 and 11, switch structures 100 are shown that each include a self-compensating anchor structure 106 according to additional embodiments of the invention. The switch structures 100 of FIGS. 10 and 11 are formed to each include two distinct cantilevered beams 104, 140 that are attached to the same anchor structure 106. The cantilevered beams 104, 140 are arranged such that a first beam 104 extends out from the anchor structure 106 in a first direction and a second beam 140 extends out from the anchor structure 106 in a second direction that is opposite the first direction. While not shown in FIGS. 10 and 11, it is recognized that in operation, each of the beams 104, 140 is selectively moved relative to a respective contact, such that a cantilevered portion 104a, 140a of each beam moves between a first, non-contacting or "open" position and a second, contacting or "closed" position, with an electrode 110 providing a potential difference between the electrode and the beam 104, 140 to generate an electrostatic force that pulls the beam toward the electrode and against the contact 102, similar to what is shown and described in FIG. 1.

According to embodiments of the invention, in a switch structure 100 that includes two distinct cantilevered beams 104, 140 positioned in a back-to-back arrangement, the anchor structure 106 may function as a self-compensating anchor structure by properly shaping an anchor connection of the anchor structure 106. That is, a shaped anchor connection is provided on anchor structure 106 that is symmetrical about a longitudinal axis 132 of the cantilevered beams 104, 140 and about an axis orthogonal to the cantilevered beams that passed through a midpoint of the anchor structure—indicated at 142. According to exemplary embodiments of the invention, the shaped anchor connection could be constructed as an I-shaped anchor connection 144 as illustrated in FIG. 10, or as an X-shaped anchor connection 146 as illustrated in FIG. 11. In each of the embodiments, the anchor connection 144, 146 provides for the anchor structure 106 to act as a self-compensating anchor structure that compensates for typical takeoff angle deformation of either/both of the cantilevered beams 104, 140 resulting from a strain mismatch between the substrate 108 and the switch structure 100—such as might occur at temperatures exceeding 300° C. The construction of the anchor connections 144, 146 functions to compensate for this takeoff angle deformation of the cantilevered portion 104a, 140a of each beam by directing a portion of strain orthogonal to the cantilevered portions 104a, 140a, with this portion of the strain developing a gradient of strain normal to the substrate 108 that warps the anchor structure 106 so as to pull the cantilevered portions 104a, 140a back into an undeflected or undeformed position.

Referring now to FIG. 12, according to another embodiment of the invention, it is recognized that rather than having a single/unitary anchor connection on the anchor structure 106, two or more distinct anchor connections 148, 150 may be provided on the anchor connection that mechanically connect the anchor structure 106 and beam 104 to the substrate 108. The two or more distinct anchor connections 148, 150 are sized/shaped, positioned, and angled on the self-compensating anchor structure 106 based on design considerations of the switch structure 100 in order to counteract/compensate for strain experienced by the cantilevered beam 104. That is, the two or more distinct anchor connections 148, 150 are sized/shaped, positioned, and angled on the self-compensating anchor structure 106 in order to direct a suitable portion of a strain mismatch between the substrate 108 and the switch structure 100 orthogonally to the cantilevered portion 104a to warp the anchor structure 106 and compensate for the takeoff angle of the cantilevered portion in a desired fashion. As one example, the anchor structure 106 may be constructed such that a pair of anchor connections 148, 150 is provided that have dimensions of 8×8 micrometers and are spaced 10 micrometers apart. As another example, the anchor structure 106 may be constructed such that a pair of anchor connections 148, 150 is provided that have dimensions of 8×8 micrometers and are spaced 30 micrometers apart.

In each of the embodiments of FIGS. 6, 7, and 10-12, it is recognized that the thickness of the cantilevered beam 104, 140 and the materials from which it is formed may also be selected—in conjunction with the sizing, geometry, and spacing of the anchor connection(s)—to counteract/compensate for strain experienced by the cantilevered beam 104, 140. According to embodiments, the cantilevered beam 104, 140 of the switch structure 100 can be a layer comprising nickel (Ni)-12 atomic percent tungsten (W), or nickel (Ni)-20 atomic percent tungsten (W). The cantilevered beam 104, 140 may also be formed of what are defined as "creep resistant" materials—with the term creep resistance as used herein referring to the ability of a material to resist time-dependent plastic deformation when subjected to continual loads or stresses. In such embodiments, the cantilevered beam 104, 140 may be formed of superalloys, including Ni-based and/or cobalt (Co)-based superalloys, Ni—W alloys, Ni—Mn alloys, gold containing small amounts of Ni and/or Co ("hard gold"), W, intermetallics, materials subject to solid solution and/or second phase strengthening, and materials having a crystal structure which inhibits plastic deformation, such as hexagonal structures or materials with low stacking fault energies. Other binary alloys, including any combination of Al, Ti, Cr, Mn, Fe, Co, Ni, Cu, Zn, Nb, Mo, Ag, Ta and W, may also be used to form the cantilevered beam 104, 140.

Beneficially, embodiments of the invention thus provide a MEMS switch and associated switch structure with a cantilevered beam and self-compensating anchor construction that reduce the impact of any strain mismatch between the switch structure and the substrate on which it is formed, such that the cantilevered beam is maintained in an undeflected or undeformed position. By providing a shaped anchor connection(s) to connect the anchor to the substrate, the typical takeoff angle deformation of a cantilever beam is compensated for via utilizing of a strain gradient in an orthogonal direction to the takeoff angle. That is, when there is strain relative to the substrate, a portion of the strain is directed orthogonal to the cantilever beam, so as to warp the anchor enough to compensate for the strain gradient from the substrate to the top of the anchor—with the strain operating through the Poisson ratio beam metal to effectively pull the cantilever beam back into position. As a result, the structure is insensitive to total strain level, thereby giving flexibility in the final strain state of the material and, in turn, providing flexibility in the processing of the switch structure.

According to one embodiment of the invention, a MEMS switch includes a substrate and a switch structure formed on the substrate, with the switch structure further including a conductive contact formed on the substrate, a self-compensating anchor structure coupled to the substrate, and a beam comprising a first end and a second end, the beam integrated with the self-compensating anchor structure at the first end and extending out orthogonally from the self-compensating anchor structure and suspended over the substrate such that the second end comprises a cantilevered portion positioned above the conductive contact. The cantilevered portion of the beam undergoes deformation during periods of strain mismatch between the substrate and the switch structure so as to have a takeoff angle relative to the substrate, and the self-compensating anchor structure directs a portion of the strain mismatch orthogonally to the cantilevered portion so as to warp the anchor and compensate for the takeoff angle of the cantilevered portion.

According to another embodiment of the invention, a method of manufacturing a MEMS switch includes providing a substrate and forming a switch structure on the substrate via a wafer level bonding process. Forming the switch structure further includes forming a conductive contact on the substrate, forming a self-compensating anchor structure, and attaching a cantilevered beam to the self-compensating anchor structure to position the cantilevered beam relative to the substrate and the conductive contact, the cantilevered beam comprising a cantilevered portion at an end thereof opposite the self-compensating anchor structure, with the self-compensating anchor structure being arranged orthogonally to the cantilevered portion of the cantilevered beam and with the cantilevered portion extending out so as to be spaced apart from the substrate and positioned above the conductive contact. The method also includes performing an annealing process on the substrate and the switch structure to achieve bonding in the MEMS switch. The cantilevered portion of the beam undergoes deformation during the annealing process responsive to a strain mismatch between the substrate and the switch structure, such that the cantilevered portion has a takeoff angle relative to the substrate, and the self-compensating anchor structure directs a portion of a strain resulting from the strain mismatch orthogonal to the cantilevered portion so as to warp the anchor structure and compensate for the takeoff angle of the cantilevered portion.

According to yet another embodiment of the invention, a MEMS switch includes a substrate and a switch structure formed on the substrate, with the switch structure further including a conductive contact formed on the substrate, an anchor structure coupled to the substrate, and a beam integrated with the anchor structure and extending out orthogonally therefrom, the beam comprising a cantilevered portion suspended over the substrate and positioned above the conductive contact. The anchor structure comprises a self-compensating anchor structure that causes the cantilevered portion to remain undeflected when subjected to thermally induced takeoff angle deformation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A micro-electromechanical system (MEMS) switch comprising:
   a substrate; and
   a switch structure formed on the substrate, the switch structure comprising:
      a conductive contact formed on the substrate;
      a self-compensating anchor structure coupled to the substrate; and
      a beam comprising a first end and a second end, the beam integrated with the self-compensating anchor structure at the first end and extending out orthogonally from the self-compensating anchor structure and suspended over the substrate such that the second end comprises a cantilevered portion positioned above the conductive contact;

wherein the cantilevered portion of the beam undergoes deformation during periods of strain mismatch between the substrate and the switch structure so as to have a takeoff angle relative to the substrate;

wherein the self-compensating anchor structure directs a portion of the strain mismatch orthogonally to the cantilevered portion so as to warp the anchor and compensate for the takeoff angle of the cantilevered portion; and wherein the self-compensating anchor structure comprises a shaped anchor connection that mechanically connects the beam to the substrate, the shaped anchor connection being formed directly on a bottom surface of the switch structure, which defines a footprint, of the self-compensating anchor structure and covering only a portion of the bottom surface, such that the shaped anchor connection is contained within the footprint of the self-compensating anchor structure.

2. The MEMS switch of claim 1 wherein the shaped anchor connection is formed as one of a C-shaped anchor connection and a V-shaped anchor connection.

3. The MEMS switch of claim 1 wherein the self-compensating anchor structure comprises two or more distinct anchor connections that mechanically connect the beam to the substrate, wherein the two or more distinct anchor connections are sized, positioned, and angled on the self-compensating anchor structure so as to direct the portion of the strain mismatch orthogonally to the cantilevered portion to warp the anchor and compensate for the takeoff angle of the cantilevered portion.

4. The MEMS switch of claim 1 wherein the strain mismatch directed orthogonally to the cantilever extends less than 20% of the length of the cantilever.

5. The MEMS switch of claim 1 wherein the portion of strain mismatch directed orthogonal to the cantilevered portion develops a gradient of strain normal to the substrate, so as to pull the cantilevered portion back into an undeflected or undeformed position.

6. The MEMS switch of claim 1 wherein the portion of strain mismatch orthogonal to the cantilevered portion provided by the self-compensating anchor operates through Poisson's ratio.

7. The MEMS switch of claim 1 wherein the deformation of the cantilevered portion of the beam comprises a thermally induced deformation resulting from a coefficient of thermal expansion (CTE) between the substrate and the switch structure.

8. The MEMS switch of claim 1 wherein the beam is formed of a creep-resistant material, the creep-resistant material comprising a superalloy, including Ni-based and/or Co-based superalloys, Ni—W alloys, Ni—Mn alloys, gold containing Ni and/or Co, W, intermetallics, materials subject to solid solution and/or second phase strengthening, or a material having a crystal structure which inhibits plastic deformation.

9. The MEMS switch of claim 1 wherein the switch structure and the substrate comprise a wafer level bonded package, with an annealing implemented to form the wafer level bonded package causing the strain mismatch between the substrate and the switch structure and causing the cantilevered portion of the beam to undergo deformation resulting in the takeoff angle.

10. The MEMS switch of claim 1 wherein the beam comprises a first beam that extends out from the self-compensating anchor structure in a first direction; and wherein the switch structure further comprises a second beam integrated with the self-compensating anchor structure, the second beam extending out from the self-compensating anchor structure in a second direction opposite the first direction in which the first beam extends.

11. The MEMS switch of claim 10 wherein the shaped anchor connection is formed as one of an I-shaped anchor connection and an X-shaped anchor connection.

12. A micro-electromechanical system (MEMS) switch comprising:
a substrate; and
a switch structure formed on the substrate, the switch structure comprising:
a conductive contact formed on the substrate;
an anchor structure coupled to the substrate; and
a beam integrated with the anchor structure and extending out orthogonally therefrom, the beam comprising a cantilevered portion suspended over the substrate and positioned above the conductive contact;
wherein the anchor structure comprises a self-compensating anchor structure that causes the cantilevered portion to remain undeflected when subjected to thermally induced takeoff angle deformation; and
wherein the anchor structure includes a shaped anchor connection that mechanically connects the anchor structure and the beam to the substrate, the shaped anchor connection formed directly on a bottom surface, which defines a footprint, of the anchor structure and covering only a portion of the bottom surface of the switch structure, such that the shaped anchor connection is contained within the footprint of the anchor structure.

13. The MEMS switch of claim 12 wherein the beam comprises a first beam that extends out from the anchor structure in a first direction, and wherein the switch structure further comprises a second beam integrated with the anchor structure, the second beam extending out from the anchor structure in a second direction opposite the first direction; and wherein the shaped anchor connection comprises one of an I-shaped connection and a X-shaped anchor connection.

14. The MEMS switch of claim 12 wherein the shaped anchor connection comprises one of a C-shaped anchor connection and a V-shaped anchor connection.

15. The MEMS switch of claim 14 wherein the cantilevered portion undergoes deformation during thermally induced periods of strain mismatch between the substrate and the switch structure, so as to cause the takeoff angle deformation; and wherein the self-compensating anchor structure directs a portion of the strain mismatch orthogonal to the cantilevered portion so as to warp the anchor structure and compensate for the takeoff angle deformation.

16. A method of manufacturing a micro-electromechanical system (MEMS) switch, the method comprising:
providing a substrate; and
forming a switch structure on the substrate via a wafer level bonding process, wherein forming the switch structure further comprises:
forming a conductive contact on the substrate;
forming a self-compensating anchor structure on the substrate, the self-compensating anchor structure comprising a shaped anchor connection formed directly on a bottom surface of the switch structure, which defines a footprint, of the self-compensating anchor structure and covering only a portion of the bottom surface, such that the shaped anchor connection is contained within the footprint of the self-compensating anchor structure; and attaching a cantilevered beam to the self-compensating anchor structure to position the cantilevered beam relative to the substrate and the conductive contact, the cantilevered beam comprising a cantilevered portion at an end thereof opposite the self-compensating anchor structure;

wherein the self-compensating anchor structure is arranged orthogonally to the cantilevered portion of the cantilevered beam, with the cantilevered portion extending out so as to be spaced apart from the substrate and positioned above the conductive contact; and performing an annealing process on the substrate and the switch structure to achieve bonding in the MEMS switch;

wherein the cantilevered portion of the beam undergoes deformation during the annealing process responsive to a strain mismatch between the substrate and the switch structure, such that the cantilevered portion has a takeoff angle relative to the substrate; and wherein the self-compensating anchor structure directs a portion of a strain resulting from the strain mismatch orthogonal to the cantilevered portion so as to warp the anchor structure and compensate for the takeoff angle of the cantilevered portion.

17. The method of claim 16 wherein the shaped anchor connection comprises one of a C-shaped anchor connection and a V-shaped anchor connection.

18. The method of claim 16 wherein attaching the cantilevered beam to the self-compensating anchor structure comprises:

attaching a first cantilevered beam to the self-compensating anchor structure such that the first cantilevered beam extends out from the self-compensating anchor structure in a first direction; and attaching a second cantilevered beam to the self-compensating anchor structure such that the second cantilevered beam extends out from the self-compensating anchor structure in a second direction opposite the first direction;

wherein the shaped anchor connection comprises one of an I-shaped anchor connection and an X-shaped anchor connection.

19. The method of claim 16 wherein the strain orthogonal to the cantilevered portion provided by the self-compensating anchor structure operates through Poisson's ratio.

* * * * *